(12) United States Patent  
Pedersen et al.

(10) Patent No.: US 9,354,611 B2
(45) Date of Patent: May 31, 2016

(54) EVENT DRIVEN SIGNAL CONVERTERS

(71) Applicant: Atmel Corporation, San Jose, CA (US)

(72) Inventors: Frode Milch Pedersen, Trondheim (NO); Laurentiu Birsan, Saint Herblain (FR); Frederic Igier, Sainte Luce sur Loire (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/526,773

(22) Filed: Oct. 29, 2014

(65) Prior Publication Data

US 2016/0124393 A1 May 5, 2016

(51) Int. Cl.
*H03M 1/50* (2006.01)
*G04F 10/00* (2006.01)
*H03M 1/12* (2006.01)

(52) U.S. Cl.
CPC .............. *G04F 10/005* (2013.01); *H03M 1/121* (2013.01)

(58) Field of Classification Search
CPC .............. H03M 1/12; H04L 7/00; H04L 12/26
USPC .................................. 341/122, 155, 161, 162
See application file for complete search history.

(56) References Cited

U.S. PATENT DOCUMENTS

| 7,068,195 | B1 * | 6/2006 | Menkus | H03L 7/0812 327/141 |
| 7,365,664 | B2 * | 4/2008 | Caduff | H03G 3/3026 341/139 |
| 7,460,062 | B2 * | 12/2008 | Nakamura | G01S 7/487 342/118 |
| 7,777,660 | B2 * | 8/2010 | Chen | G09G 3/20 341/155 |
| 8,855,181 | B2 * | 10/2014 | Barrenscheen | H04L 7/0033 375/219 |

* cited by examiner

*Primary Examiner* — Peguy Jean Pierre
(74) *Attorney, Agent, or Firm* — Fish & Richardson P.C.

(57) ABSTRACT

In some implementations, a method comprises: generating, by an event system of an integrated circuit, a first event signal in response to a clock signal; distributing the first event signal to a first digital converter, where the first event signal triggers conversion of a first analog signal to a first digital value by the first digital converter; generating, by the event system, a second event signal in response to the clock signal; and distributing the second event signal to a second digital converter, where the second event signal triggers conversion of a second analog signal to a second digital value.

20 Claims, 2 Drawing Sheets

EVENT DRIVEN SIGNAL CONVERTERS

TECHNICAL FIELD

This disclosure relates generally to event drive conversion.

BACKGROUND

In example scenario, a particular time-interleaved digitizing system that includes two or more interleaved digital converters can be used to provide a high sample rate for converting analog signals to digital signals. For example, a time-interleaved analog-to-digital converter (ADC) may include N parallel ADCs where each ADC samples data every $N^{th}$ cycle of a sample clock. The timing of the ADCs involves complex multiplexing and timing circuitry. Such complex architectures, however, can increase gate count and current consumption, which may not be acceptable for some low-power applications.

SUMMARY

In some implementations, a method comprises: generating, by an event system of an integrated circuit, a first event signal in response to a clock signal; distributing the first event signal to a first digital converter, where the first event signal triggers conversion of a first analog signal to a first digital signal by the first digital converter; generating, by the event system, a second event signal in response to the clock signal; and distributing the second event signal to a second digital converter, where the second event signal triggers conversion of a second analog signal to a second digital signal.

In some implementations, a system comprises: a first digital converter configured to convert a first analog signal to a first digital signal in response to an event signal; a second digital converter configured to convert a second analog signal to a second digital signal in response to the event signal; an event system configured to generate the event signal in response to an event; and an event distribution circuit configured to alternately provide the event signal to the first and second digital converters.

In some implementations, a microcontroller system comprises: a central processing unit; first and second digital converters; a bus coupling the central processing unit to the first and second digital converters; an event system coupled to the central processing unit and configured to generate an event signal in response to an event and to send the event signal over an event system channel; the first digital converter coupled to the event system and configured to convert a first analog signal to a first digital signal in response to the event signal; the second digital converter coupled to the event system and configured to convert a second analog signal to a second digital signal in response to the event signal; and an event distribution circuit coupled to the event system and the first and second digital converters, the event distribution circuit configured to alternately provide the event signal to the first and second digital converters.

Other implementations disclosed herein are directed to methods, circuits and systems.

DETAILED DESCRIPTION

Figure 1:
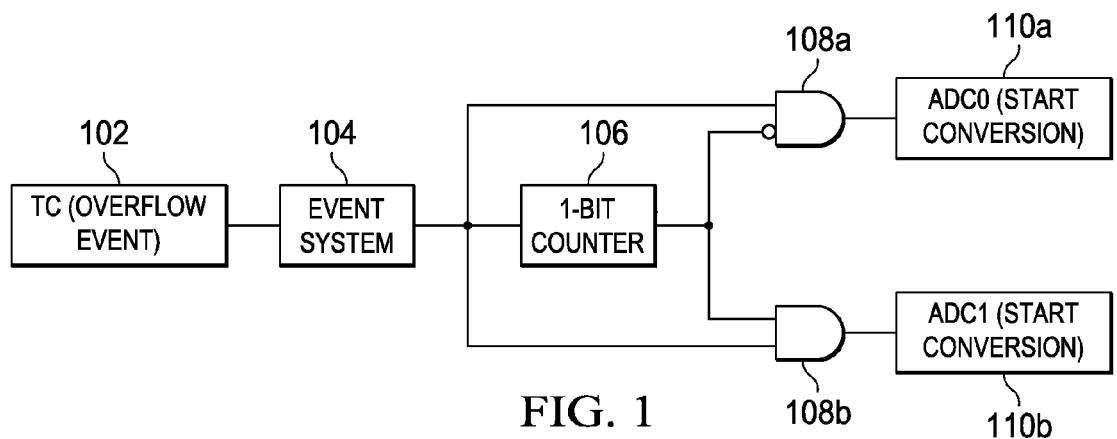
FIG. 1 is a block diagram of an example event driven dual digital converter system in an embodiment.

FIG. 1 is a block diagram of an example event driven dual digital converter system 100. In some implementations, converter system 100 can include timer/counter (TC) 102, event system 104, selection circuit 106, gates 108a, 108b and ADCs 110a, 110b.

TC 102 is a peripheral that counts clock pulses until a TOP value (or overflow) is reached at which time an event is triggered (hereafter "TC event"). Event system 104 is a routing network independent of data bus paths that allows peripherals to communicate directly with each other without involving a central processing unit (CPU) or bus resources. Different triggers at the peripheral level can result in an event, which can be indicated by logic values, e.g., 1 or 0. In the example converter system 100, TC 102 triggers conversion of analog signals to digital signals in ADCs 110a, 110b. In some implementations, TC 102 counts clock pulses until Bottom value is reached (down counter from Top value) at which time a TC event is triggered.

In operation, event system 104 routes the TC event to selection circuit 106 and gates 108a, 108b. In some implementations, selection circuit 106 is a 1-bit counter. Gates 108a, 108b receive the TC event from event system 104 and the output of 1-bit counter 106. Gate 108b inverts the output of selection circuit counter 106. After initialization, selection circuit 106 outputs 0. When the TC event is received from event system 104, selection circuit 106 outputs 1. When selection circuit outputs 1 and the TC event is received, selection circuit 106 outputs 0. The outputs of gates 118a, 118b initiate conversion of analog signals to digital values by ADCs 110a, 110b, respectively. In the example shown, gates 118a, 118b are AND gates. Other logic (e.g., a comparator) can be used to perform a gating function depending on the application. When ADC conversion is initiated, the ADC will sample an analog input signal during a sampling time ($t_{sample}$). When the sampling is completed, the ADC will convert the sample into a digital value, which can be stored in a software accessible RESULT register 112 or other suitable storage device (e.g., memory) after a conversion time ($t_{convert}$). ADC 110a (ADC0) will receive the TC event only if selection circuit 106 outputs a 0. ADC 110b (ADC1) will receive the TC event only if selection circuit 106 outputs a 1. A new sample can be taken after time period $t_{sample}+t_{convert}$.

Although the example described above in reference to FIG. 1 was for a dual digital conversion system (two ADCs), system 100 is generally applicable to converter systems with N ADCs, where N is a positive integer greater or equal to 2. For converter systems that include N ADCs, where N>2, an n-bit counter can be used instead of a 1-bit counter. Generally, in a system that includes N ADCs, the Nth event would be distributed to the Nth ADC (ADC_N) and the n-bit counter would count from 0 to N−1. For example, a system with 4 ADCs could use a 2-bit counter to count from 0 to 3. In a 4 ADC system, ADC0 receives an event if an event is received and counter=0; ADC1 receives an event if an event is received and counter=1; ADC2 receives an event if an event is received and counter=2; and ADC2 receives an event if an event is received and counter=3.

Figure 2:
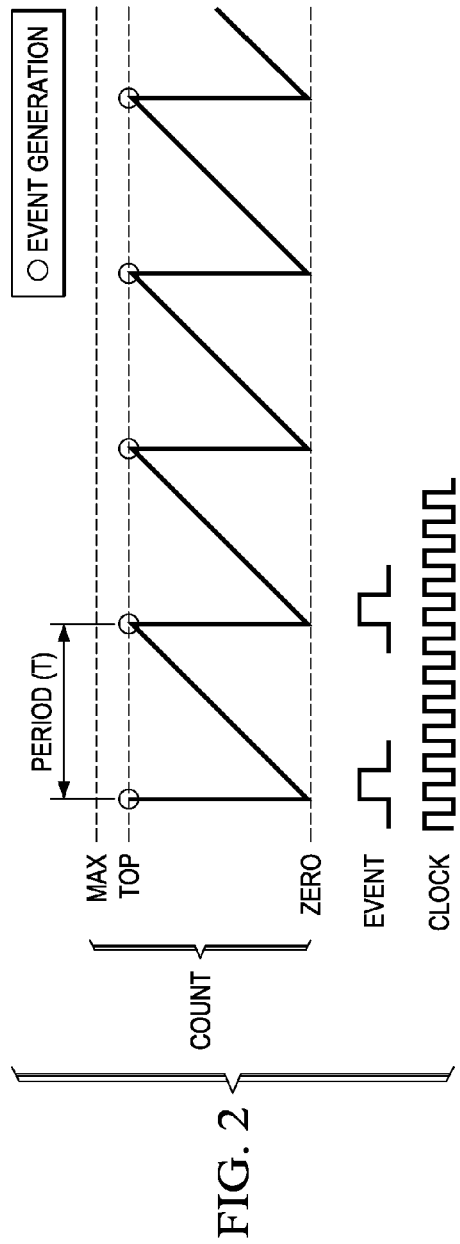
FIG. 2 is a timing diagram illustrating an example timer/counter (TC) operation and example event generation in an embodiment.

FIG. 2 is a timing diagram illustrating an example TC 102 operation and TC event generation. TC 102 counts each clock pulse from BOTTOM until a threshold value (referred herein as "TOP") is reached after a period (T). When the TOP value is reached the TC event is generated and selection circuit 106 wraps to 0. In some implementations, a TOP value can be programmed in a register as $$TOP = \frac{(t_{sample} + t_{convert})}{(2 * TC\_Clock\_Period)},$$ [1]

where TC_Clock Period is the clock period of TC 102.

Figure 3:
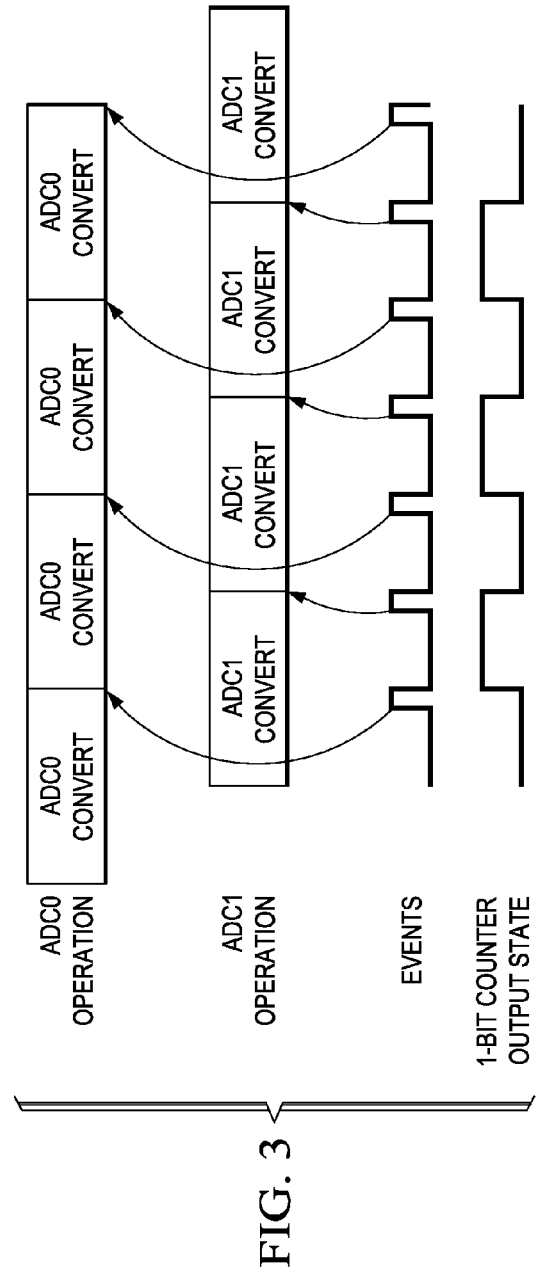
FIG. 3 illustrates an example ADC operation when receiving event signals in an embodiment.

FIG. 3 illustrates ADC operation when receiving event signals. In some implementations, TC 102 is configured to generate events two times faster than the speed of ADCs 110*a*, 110*b*. In this example, each ADC 110*a*, 110*b* will accept every second event signal and an ADC overrun will not be generated. As shown in FIG. 3, ADC operation is initiated when an event signal is received. For example, if the output state of selection circuit 106 is 0 when an event signal is received, ADC 110*a* (ADC0) starts converting. If the output state of selection circuit 106 is 1 when an event signal is received, ADC 110*b* (ADC1) starts converting.

Figure 4:
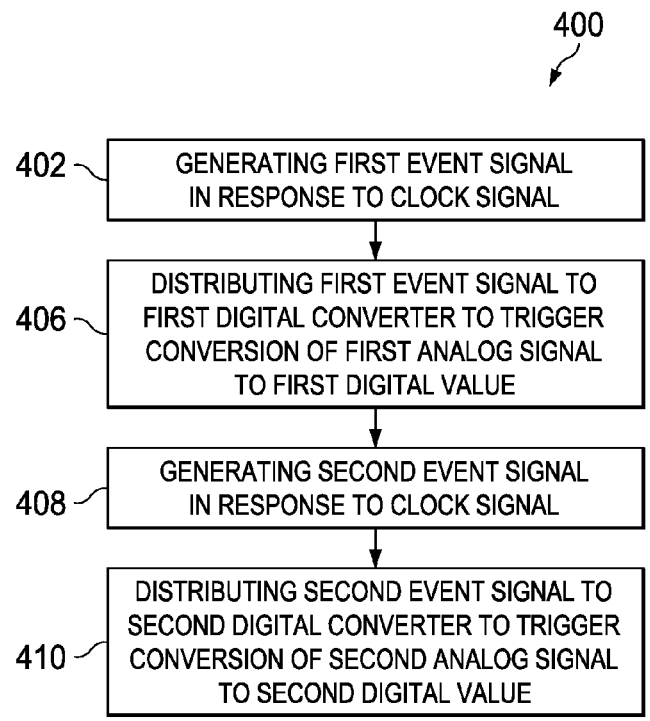
FIG. 4 is a flow diagram of an example process of event driven dual digital conversion in an embodiment.

FIG. 4 is a flow diagram of an example process 400 of event driven dual digital conversion. In some implementations, process 400 can begin by generating a first event signal in response to a clock signal (402). For example, when TC 102 reaches the TOP value, an event signal is generated.

Process 400 can continue by distributing the first event signal to a first ADC to trigger conversion of a first analog signal into a digital value (404). For example, event system 104 can route the first event signal to selection circuit 106 and gates 108*a*, 108*b*, as described in reference to FIG. 1. The selection circuit 106 and gates 108*a*, 108*b* can distribute the first event signal to a first ADC 110*a* to initiate conversion. Conversion includes sampling the analog signal and converting the sample into a digital value using ADC conversion techniques.

Process 400 can continue by generating a second event signal in response to the clock signal (406). For example, when TC 102 reaches the TOP value, a second event signal is generated.

Process 400 can continue by distributing the second event signal to a second ADC to trigger conversion of a second analog signal (or the same analog signal) into a digital value (404). For example, event system 104 can route the second event signal to selection circuit 106 and gates 108*a*, 108*b*, as described in reference to FIG. 1.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
    configuring a counter to increment according to a clock signal;
    determining that a first count of the counter has reached a first threshold value after a first time period;
    responsive to the determining that the first count of the counter has reached the first threshold value after the first time period, generating a first event signal;
    distributing the first event signal to a first digital converter, where the first event signal triggers conversion of a first analog signal to a first digital signal by the first digital converter;
    determining that a second count of the counter has reached a second threshold value after a second time period following the first time period;
    responsive to the determining that the second count of the counter has reached the second threshold value after the second time period, generating a second event signal; and
    distributing the second event signal to a second digital converter, where the second event signal triggers conversion of a second analog signal to a second digital signal.

2. The method of claim 1, where distributing the first event signal further comprises:
    gating the first event signal with an output of a 1-bit counter, the 1-bit counter having an input coupled to the first event signal.

3. A system comprising:
    a first digital converter configured to convert a first analog signal to a first digital signal in response to an event signal, where the event is a count of a counter reaching a threshold value after a time period, the counter configured to count pulses of a clock signal;
    a second digital converter configured to convert a second analog signal to a second digital signal in response to the event signal;
    an event system configured to generate the event signal in response to an event; and
    an event distribution circuit coupled to the event system and the first and second digital converters, the event distribution circuit configured to alternately provide the event signal to the first and second digital converters.

4. The system of claim 3, where the event system generates the event signal at least two times faster than the conversion of the first or second analog signal to the first or second digital signal, respectively.

5. The system of claim 4, further comprising:
    a register programmed with the threshold value of the counter, given by $$Top = \frac{(t_{sample} + t_{convert})}{(2 * TC\_Clock\_Period)},$$

where $t_{sample}$ is a sample time, $t_{convert}$ is a conversion time and TC_Clock_Period is a period of the clock signal.

6. The system of claim 4, where the first and second digital converters are analog-to-digital converters.

7. The system of claim 3, where the event distribution circuit further comprises:
    a selection circuit having an input coupled to an output of the event system, the selection circuit configured for outputting first and second logic values in response to the event signal;
    a first logic coupled to the selection circuit output and the first digital converter, the first logic configured to start converting the first analog signal to the first digital signal in response to the first logic value; and a second logic coupled to the selection circuit output and the second digital converter, the second logic configured to start converting the second analog signal to the second digital signal in response to the second logic value.

8. The system of claim 7, where the selection circuit is a counter.

9. The system of claim 7, where the first and second logic include at least one AND gate.

10. A circuit comprising:
a central processing unit;
first and second digital converters;
a bus coupling the central processing unit to the first and second digital converters;
an event system coupled to the central processing unit and configured to generate an event signal in response to an event and to send the event signal over an event system channel;
the first digital converter coupled to the event system and configured to convert a first analog signal to a first digital signal in response to the event signal;
the second digital converter coupled to the event system and configured to convert a second analog signal to a second digital signal in response to the event signal; and
an event distribution circuit coupled to the event system and the first and second digital converters, the event distribution circuit configured to alternately provide the event signal to the first and second digital converters.

11. The circuit of claim 10, where the event is a count of a counter reaching a threshold value after a time period, the counter configured to count pulses of a clock signal.

12. The circuit of claim 11, further comprising:
a register programmed with the threshold value of the counter, given by $$Top = \frac{(t_{sample} + t_{convert})}{(2 * TC\_Clock\_Period)},$$

where $t_{sample}$ is a sample time, $t_{convert}$ is a conversion time and TC_Clock_Period is a period of the clock signal.

13. The circuit of claim 11, where the first and second digital converters are analog-to-digital converters.

14. The circuit of claim 10, where the event distribution circuit further comprises:
a selection circuit having an input coupled to an output of the event system, the selection circuit configured for outputting first and second logic values in response to the event signal;
a first logic coupled to the selection circuit output and the first digital converter, the first logic configured to start converting the first analog signal to the first digital signal in response to the first logic value; and
a second logic coupled to the selection circuit output and the second digital converter, the second logic configured to start converting the second analog signal to the second digital signal in response to the second logic value.

15. The circuit of claim 14, where the selection circuit is a counter.

16. The circuit if claim 15, where the counter is a 1-bit counter.

17. The circuit of claim 14, where the first and second logic include at least one AND gate.

18. The circuit of claim of claim 10, where the event system channel allows circuit components to communicate directly with each other without involving the central processing unit or bus.

19. The circuit of claim 10, where the circuit is included in a microcontroller unit.

20. The circuit of claim 10, where the event system generates the event signal at least two times faster than the conversion of the first or second analog signal to the first or second digital signal, respectively.

* * * * *